US012772373B2

(12) United States Patent
Ugale et al.

(10) Patent No.: US 12,772,373 B2
(45) Date of Patent: Oct. 20, 2026

(54) SEMICONDUCTOR MODULE AND METHOD FOR FABRICATING A SEMICONDUCTOR MODULE

(71) Applicant: Infineon Technologies AG, Neubiberg (DE)

(72) Inventors: Ramdas Rangnath Ugale, Villach (AT); Daniel Schleißer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 558 days.

(21) Appl. No.: 18/224,265

(22) Filed: Jul. 20, 2023

(65) Prior Publication Data

US 2024/0040689 A1 Feb. 1, 2024

(30) Foreign Application Priority Data

Aug. 1, 2022 (DE) ......................... 102022119251.2

(51) Int. Cl.
*H05K 1/02* (2006.01)
*H01L 23/40* (2006.01)
(Continued)

(52) U.S. Cl.
CPC ............. *H05K 1/0265* (2013.01); *H05K 1/18* (2013.01); *H05K 3/325* (2013.01); *H05K 7/209* (2013.01);
(Continued)

(58) Field of Classification Search
CPC . H01L 2224/48247; H01L 2224/73265; H01L 23/3107; H01L 23/4334; H01L 25/072; H01L 2924/13091; H01L 23/49575; H01L 2924/1305; H01L 23/3735; H01L 23/36; H01L 21/4882; H01L 2224/4903; H01L 2224/48139;
(Continued)

(56) References Cited

U.S. PATENT DOCUMENTS 4,992,925 A * 2/1991 Meyer ................ H05K 7/14329 363/141
8,907,477 B2 * 12/2014 Yamada ................ H01L 25/115 257/737
(Continued)

FOREIGN PATENT DOCUMENTS

CN 106452112 A 2/2017
DE 102008045409 A1 3/2009
(Continued)

*Primary Examiner* — Michael A Matey
(74) *Attorney, Agent, or Firm* — Murphy, Bilak & Homiller, PLLC

(57) ABSTRACT

A semiconductor module includes: a printed circuit board having a first side and an opposite second side; a plurality of power semiconductor packages arranged over and electrically coupled to the first side of the printed circuit board, a first side of the power semiconductor packages facing the first side of the printed circuit board and an opposite second side being configured to be coupled to a heatsink; and at least one bus bar arranged over and electrically coupled to the first side of the printed circuit board. The bus bar is configured to carry a supply current and/or a ground current of at least some of the power semiconductor packages.

18 Claims, 6 Drawing Sheets

(51) Int. Cl.

| | |
|---|---|
| ***H05K 1/18*** | (2026.01) |
| ***H05K 3/32*** | (2026.01) |
| ***H05K 3/325*** | (2026.01) |
| ***H05K 7/20*** | (2006.01) |
| ***H10W 40/60*** | (2026.01) |
| *H10W 40/20* | (2026.01) |

(52) U.S. Cl.

CPC . *H10W 40/611* (2026.01); *H05K 2201/10015* (2013.01); *H05K 2201/1003* (2013.01); *H05K 2201/10166* (2013.01); *H05K 2201/10174* (2013.01); *H05K 2201/10272* (2013.01); *H05K 2201/10409* (2013.01); *H05K 2201/10522* (2013.01); *H05K 2201/10545* (2013.01); *H10W 40/231* (2026.01); *H10W 40/235* (2026.01); *H10W 40/242* (2026.01)

(58) Field of Classification Search

CPC . H01L 23/34; H01L 23/5286; H01L 23/5383; H01L 23/5385; H01L 2023/405; H01L 2023/4062; H01L 2023/4068; H01L 21/4821; H01L 23/10; H01L 23/49534; H01L 23/49822; H01L 2924/15153; H01L 23/4006; H01L 2023/4031; H05K 3/0061; H05K 1/0203; H05K 1/144; H05K 1/189; H05K 2201/043; H05K 2203/1316; H05K 2203/1572; H05K 3/284; H05K 7/209; H05K 1/141; H05K 1/181; H05K 2201/10272; H05K 2201/10522; H05K 2201/10409; H05K 2201/10545; H05K 3/202; H05K 5/0204; H05K 7/14329; H05K 7/02; H05K 7/20409; H05K 7/20509; H05K 7/20854; H05K 1/0265; H05K 1/18; H05K 3/325; H05K 2201/10015; H05K 2201/1003; H05K 2201/10166; H05K 2201/10174; B29C 45/14655; H02M 7/003; Y10T 29/4913

See application file for complete search history.

(56) References Cited

U.S. PATENT DOCUMENTS

| | | | | |
|---|---|---|---|---|
| 10,442,372 | B2 * | 10/2019 | Maeda | B60R 16/0238 |
| 2002/0008963 | A1 * | 1/2002 | DiBene, II | H05K 7/1092<br>361/720 |
| 2004/0089943 | A1 * | 5/2004 | Kirigaya | H05K 1/144<br>438/125 |
| 2006/0039127 | A1 * | 2/2006 | West | H05K 1/144<br>257/691 |
| 2006/0092599 | A1 * | 5/2006 | Yamamura | H05K 1/0263<br>361/611 |
| 2010/0084758 | A1 * | 4/2010 | Mun | H01L 23/16<br>257/E23.06 |
| 2010/0134979 | A1 * | 6/2010 | Obiraki | H10W 40/255<br>361/822 |
| 2013/0001759 | A1 * | 1/2013 | Kim | H10W 70/442<br>438/122 |
| 2013/0077255 | A1 * | 3/2013 | Abe | H05K 7/209<br>361/716 |
| 2013/0314877 | A1 * | 11/2013 | Watanabe | H10W 40/00<br>257/687 |
| 2016/0021748 | A1 * | 1/2016 | Kageyama | H05K 1/181<br>361/767 |
| 2016/0343641 | A1 * | 11/2016 | Hori | H01L 23/3107 |
| 2017/0236774 | A1 * | 8/2017 | Fushie | H01L 23/5286<br>257/675 |
| 2018/0255658 | A1 * | 9/2018 | Kaneko | H05K 5/0034 |
| 2020/0266121 | A1 * | 8/2020 | Fuergut | H01L 25/072 |
| 2020/0328140 | A1 * | 10/2020 | Tey | H10W 70/481 |
| 2021/0185794 | A1 * | 6/2021 | Snyder | H05K 1/0204 |
| 2023/0025736 | A1 * | 1/2023 | Grassmann | H01L 23/49503 |

FOREIGN PATENT DOCUMENTS

| | | | | |
|---|---|---|---|---|
| JP | 2009117805 A | * | 5/2009 | H02B 1/20 |
| JP | 2019201187 A | | 11/2019 | |

* cited by examiner

SEMICONDUCTOR MODULE AND METHOD FOR FABRICATING A SEMICONDUCTOR MODULE

TECHNICAL FIELD

This disclosure relates in general to a semiconductor module as well as to a method for fabricating a semiconductor module.

BACKGROUND

Semiconductor modules may comprise a plurality of power semiconductor packages arranged on and electrically coupled to a printed circuit board. During operation, these power semiconductor packages generate heat which has to be dissipated. Furthermore, such semiconductor modules may have to be configured to handle strong currents and/or high voltages. Fulfilling these requirements may have a significant impact on the overall costs and/or the size of the semiconductor module. However, for many applications it may be desirable to have a semiconductor module with a reduced size and/or reduced costs without the electrical and/or thermal characteristics of the semiconductor module being negatively affected. Improved semiconductor modules as well as improved methods for fabricating semiconductor modules may help in solving these and other problems.

The problem on which the invention is based is solved by the features of the independent claims. Further advantageous examples are described in the dependent claims.

SUMMARY

Various aspects pertain to a semiconductor module, comprising: a printed circuit board comprising a first side and an opposite second side, a plurality of power semiconductor packages arranged over and electrically coupled to the first side of the printed circuit board, wherein a first side of the power semiconductor packages faces the first side of the printed circuit board and an opposite second side is configured to be coupled to a heatsink, and at least one bus bar arranged over and electrically coupled to the first side of the printed circuit board, wherein the bus bar is configured to carry a supply current and/or a ground current of at least some of the power semiconductor packages.

Various aspects pertain to a method for fabricating a semiconductor module, the method comprising: providing a printed circuit board comprising a first side and an opposite second side, arranging a plurality of power semiconductor packages over the first side of the printed circuit board such that a first side of the power semiconductor packages faces the first side of the printed circuit board and electrically coupling the power semiconductor packages to the printed circuit board, wherein a second side of the power semiconductor packages, the second side being opposite the first side, is configured to be coupled to a heatsink, and arranging at least one bus bar over the first side of the printed circuit board and electrically coupling the bus bar to the printed circuit board, wherein the bus bar is configured to carry a supply current and/or a ground current of at least some of the power semiconductor packages.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, directional terminology such as "top", "bottom", "left", "right", "upper", "lower", etc. is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless of whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

An efficient semiconductor module and an efficient method for fabricating a semiconductor module may for example reduce material consumption, ohmic losses, chemical waste, etc. and may thus enable energy and/or resource savings. Improved semiconductor modules and improved methods for fabricating a semiconductor module, as specified in this description, may thus at least indirectly contribute to green technology solutions, i.e. climate-friendly solutions providing a mitigation of energy and/or resource use.

Figure 1A:
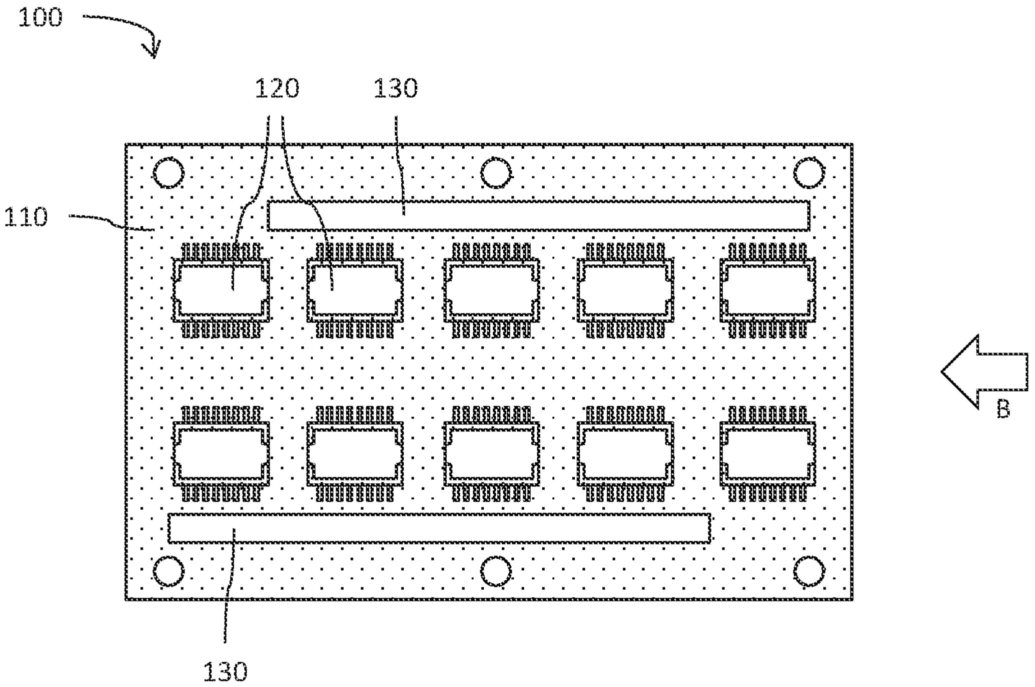
FIGS. 1A and 1B show a plan view (FIG. 1A) and a side view (FIG. 1B) of a semiconductor module, wherein at least one bus bar is arranged over a side of a printed circuit board.
Figure 1B:
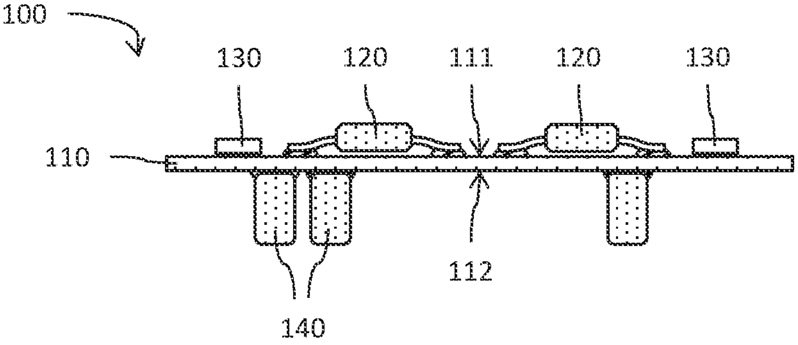

FIGS. 1A and 1B show a semiconductor module 100 comprising a printed circuit board (PCB) 110, a plurality of semiconductor packages 120 and at least one bus bar 130. FIG. 1A shows a plan view of the semiconductor module 100 and FIG. 1B shows a side view along the arrow B.

The semiconductor module 100 may be a power semiconductor module, configured to operate with a nigh voltage and/or a strong current. The semiconductor module 100 may comprise any suitable electrical circuitry and may for example comprise a converter circuit, an inverter circuit, a half-bridge circuit, etc. The semiconductor module 100 may be configured to be coupled to a heatsink, as described further below.

The printed circuit board 110 comprises a first side 111 and an opposite second side 112. The semiconductor packages 120 and the bus bar(s) 130 are arranged over the first side 111.

According to an example, no semiconductor packages 120 are arranged over the second side 112. According to another example, at least one semiconductor package 120 is arranged over the second side 112 (in other words, in the latter case semiconductor packages 120 are arranged over both the first 111 and the second side 112).

According to an example, a plurality of electric components 140 is arranged over the second side 112 of the PCB 110. The electric components 140 may for example comprise passive components like capacitances and inductors and/or active components like transistors and diodes. The electric components 140 may be electrically coupled to the semiconductor packages 120 via the PCB 110 and be part of the electrical circuitry of the semiconductor module 100. One or more of the plurality of electric components 140 may also be arranged at the first side 111, e.g. gate and snubber passive components.

The printed circuit board 110 may have any suitable shape and any suitable dimensions. For example, the printed circuit board 110 may have an essentially rectangular shape or an essentially quadratic shape as viewed from above the first side 111. The PCB 110 may for example have a length and/or a width measured along an edge of the first side 111 of 3 cm or more, or 5 cm or more, or 10 cm or more, or 15 cm or more, or or more, or 30 cm or more. The PCB 110 may for example have a thickness measured perpendicular to the first side 111 of 1 mm or more, or 2 mm or more, or 3 mm or more, or 5 mm or more, or 6 mm or more.

The PCB 110 may comprise any suitable dielectric material, for example a FR-4 type laminate. The PCB 110 may comprise a single electrically conductive layer arranged in or on the dielectric material or a plurality of conductive layers. According to an example, the PCB 110 may be comparatively cheap and/or have a comparatively low thermal conductivity and/or a comparatively low electrical conductivity, as explained further below.

The power semiconductor packages 120 may each comprise at least one power semiconductor die arranged on a die carrier, an encapsulation encapsulating the power semiconductor die and external contacts exposed from the encapsulation and electrically coupled to the PCB 110. The encapsulation may for example comprise a molded body. The die carrier and/or the external contacts may for example be leadframe parts. The power semiconductor dies may for example comprise a transistor and/or a diode. The power semiconductor packages 120 may, for example, be suitable transistor outline (TO) packages.

The power semiconductor packages 120 may comprise a first side, an opposite second side and lateral sides connecting the first and second sides. The first side of the power semiconductor packages 120 faces the first side 111 of the PCB 110 and the second side of the semiconductor packages 120 is configured to be coupled to a heatsink. To this end, the second side of the semiconductor packages 120 may e.g. comprise an exposed metal pad. The external contacts may for example be exposed at the lateral sides and/or at the first side of the semiconductor packages 120.

The at least one bus bar 130 is arranged over and electrically coupled to the first side 111 of the printed circuit board 110. In the example shown in FIGS. 1A and 1B, the semiconductor module 100 comprises two bus bars 130. However, the semiconductor module 100 may comprise any suitable number of bus bars 130.

As shown in FIGS. 1A and 1B, the bus bar(s) 130 may for example be arranged laterally next to the semiconductor packages 120. The semiconductor packages 120 may for example be arranged in one or more rows over the first side 111 of the PCB 110 and a bus bar 130 may be arranged next to each of these rows. As shown in FIGS. 1A and 1B, the bus bars 130 may be arranged closer to the edge of the PCB 110 than the rows of semiconductor packages 120. However, it is also possible that one or more of the bus bars 130 is arranged closer to the center of the first side 111 of the PCB 110 than the semiconductor packages 120.

The at least one bus bar 130 may comprise or consist of any suitable metal or metal alloy. The bus bar 130 may for example comprise or consist of Al, Cu or Fe. According to an example, the bus bar 130 comprises a plating, e.g. a Ni plating. According to an example, the bus bar 130 is a monobloc part, in particular a monobloc sheet metal.

According to an example, the bus bar 130 is at least partially covered with an electrically isolating layer. The isolating layer may for example cover at least those sides of the bus bar 130 that face away from the PCB 110. The isolating layer may for example be configured to electrically isolate the bus bar from a heatsink arranged over the semiconductor module 100. The bus bar 130 may be covered with the isolating layer prior to arranging the bus bar 130 over the PCB 110 or afterwards.

The bus bar 130 may have any suitable shape and any suitable dimensions. As shown in FIG. 1A, the bus bar 130 may for example have an essentially rectangular shape. A length of the longer side of the bus bar 130 may for example be 2 cm or more, or 4 cm or more, or 8 cm or more, or 12 cm or more, or 20 cm or more. A length of the shorter side of the bus bar 130 may for example be 3 mm or more, or 6 mm or more, or 10 mm or more, or 15 mm or more. A thickness of the bus bar 130 may for example be 0.5 mm or more, or 1 mm or more, or 1.5 mm or more, or 2 mm or more, or 3 mm or more.

Being arranged "over" the first side 111 of the PCB 110 may mean that the bus bar 130 is arranged on top of the first side 111, without being embedded in the PCB 110 (compare the cross section shown in FIG. 1B).

The bus bar 130 is configured to carry a supply current and/or a ground current of at least some of the power semiconductor packages 120. The bus bar 130 may in particular be electrically coupled to at least some of the semiconductor packages 120 via the PCB 110. In other words, an internal wiring of the PCB 110 may be used to couple the semiconductor packages 120 and the bus bar 130, both of which are external to the PCB 110 (i.e. arranged over and coupled to the PCB 110).

Arranging the bus bar(s) 130 over the first side 111 of the PCB 110, in particular over the same side of the PCB 110 as the semiconductor packages 120, may have several advantages. For example, the bus bar(s) 130 take up only very little space on the second side 112 of the PCB 110 (e.g. only the space necessary for screws affixing the bus bar 130 to the PCB 110). Furthermore, only a minimum amount of vias may be necessary to couple the bus bar 130 to the respective semiconductor packages 120. Since the bus bar(s) 130 are used to conduct high currents running through the semiconductor module 100, the PCB 110 may not be required to carry these currents. Therefore, a comparatively cheaper PCB may be used. Using the bus bar(s) 130 may also improve the heat dissipation capabilities of the semiconductor module 100, as explained further below.

Figure 2A:
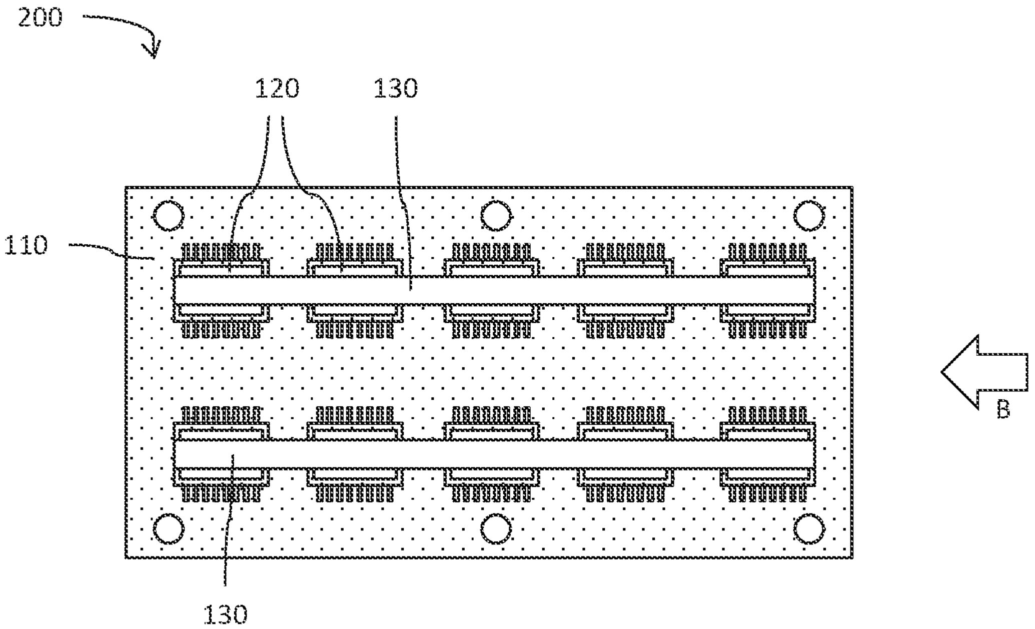
FIGS. 2A and 2B show a plan view (FIG. 2A) and a side view (FIG. 2B) of a further semiconductor module, wherein at least one bus bar is arranged over a plurality of power semiconductor packages.
Figure 2B:
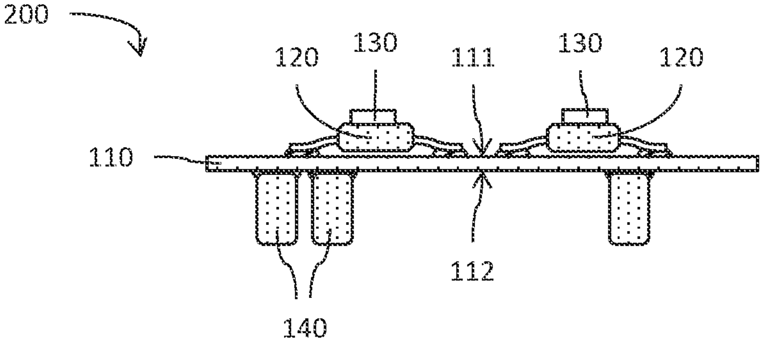

FIGS. 2A and 2B show a further semiconductor module 200 which may be similar or identical to the semiconductor module 100, except for the differences described in the following. FIG. 2A shows a plan view of the semiconductor module 200 and FIG. 2B shows a side view along the arrow B.

In particular, the bus bar 130 is arranged over and electrically coupled to the second side of at least some of the power semiconductor packages 120. In other words, in the semiconductor module 200 at least one bus bar 130 is not arranged laterally next to the semiconductor packages 120 but instead on top of the semiconductor packages 120. In this case, the second side of these semiconductor packages 120 may comprise an external contact, wherein the bus bar 130 is coupled to this external contact.

According to an example, the bus bar 130 is coupled to the external contact on the second side of the semiconductor packages 120 via a solder joint or a glued joint. According to another example, no such joint is used and the bus bar 130 is in direct contact with the external contacts of the semiconductor packages 120. In both cases, the bus bar 130 may be mechanically coupled to the PCB 110 and/or the semiconductor packages 120, e.g. via screws, pins, or rivets.

As shown in FIGS. 2A and 2B, the semiconductor module 200 may for example comprise two bus bars 130 which are arranged on top of two rows of semiconductor packages 120.

Arranging the bus bar 130 on the semiconductor packages 120 may save space on the PCB 110 and/or reduce the complexity of electrical connections the PCB 110 has to provide.

Figure 3A:
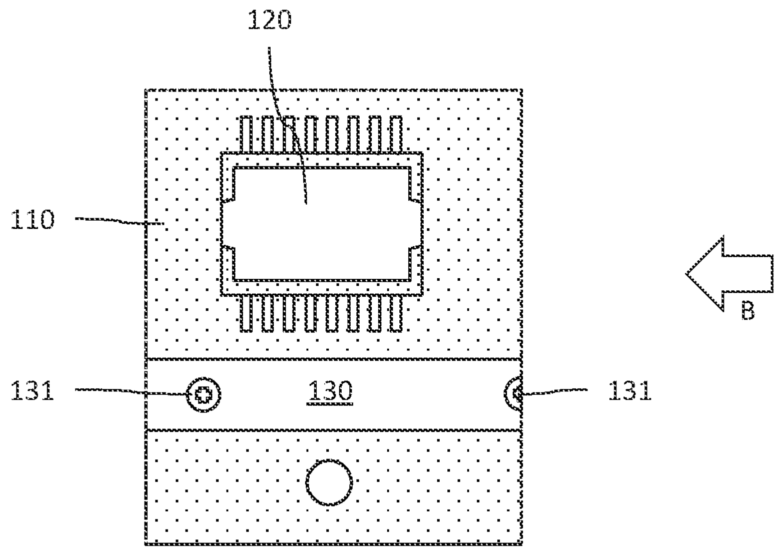
FIGS. 3A and 3B show a plan view (FIG. 3A) and a side view (FIG. 3B) of a detail of a semiconductor module.
Figure 3B:
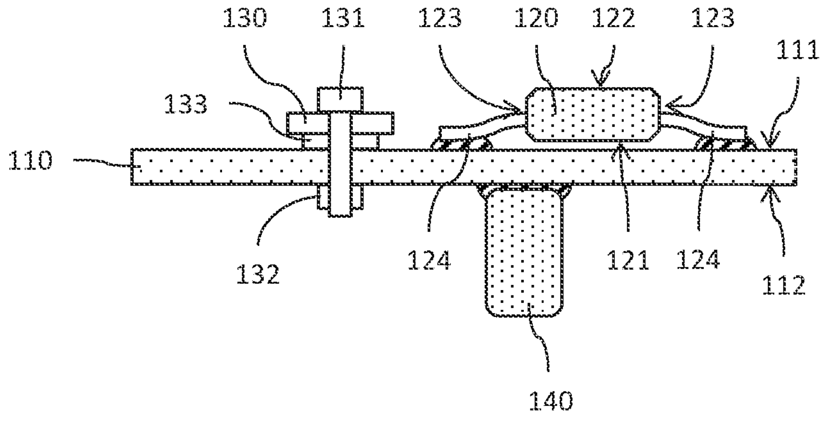

FIGS. 3A and 3B show a detailed view of the semiconductor module 100 according to a specific example. FIG. 3A shows a plan view and FIG. 3B shows a side view along the arrow B.

In the example shown in FIGS. 3A and 3B, the bus bar 130 is mechanically and/or electrically coupled to the PCB 110 by screws 131. The screws 131 may for example be fastened to the PCB 110 with nuts 132. The nuts 132 may e.g. be arranged on the second side 112 of the PCB 110.

According to an example, rivets or pins, in particular press fit pins, may be used to join the bus bar 130 to the PCB 110 instead of the screws 131 or in addition to the screws 131. The screws 131 and/or the rivets and/or the pins may extend through vias in the PCB 110.

According to an example, spacers 133 are arranged between the PCB 110 and the bus bar 130. The spacers 133 may for example be washers. Separating the bus bar 130 from the PCB 110 with the spacers 133 may for example help in countering a warpage of the PCB 110. In other words, the bus bar(s) 130 may be used to straighten a warped PCB 110.

The spacers 133 may have any suitable thickness, the thickness being measured perpendicular to the first and second sides 111, 112 of the PCB 110. For example, the thickness of the spacers 133 may be 0.5 mm or more, or 1 mm or more, or 1.5 mm or more, or 2 mm or more, or 3 mm or more, or 5 mm or more. In other words, the bus bar 130 may be arranged at a distance from the first side 111 of the PCB 110 equal to this thickness value.

As shown in FIG. 3B, the semiconductor packages 120 may comprise a first side 121, an opposite second side 122 and lateral sides 123 connecting the first and second sides 121, 122. The first side 121 faces the PCB 110 and the second side 122 faces away from the PCB 110.

According to an example, external contacts 124 may be exposed from art encapsulation of the semiconductor packages 120 at one or more of the lateral sides 123, e.g. at two opposite lateral sides 123. As shown in FIGS. 3A and 3B, the external contacts 124 may for example have a gull wing configuration. However, it is also possible that the semiconductor packages 120 comprise other types of external contacts and/or that the external contacts are arranged not (only) on the lateral sides 123 but (also) on the first side 121. For example, the semiconductor packages 120 may comprise external contacts which do not extend beyond a circumference of the first and second sides 121, 122 ("non-leaded package"), ball-grid array type contacts, land-grid array type contacts, etc.

A primary path for dissipating heat away from the semiconductor packages 120 may point from the second side 122 upwards (i.e. towards a heatsink). Only a comparatively small percentage of the heat generated by the semiconductor packages 120 might be dissipated towards the PCB 110 (for example via the external contacts 124).

Figure 4A:
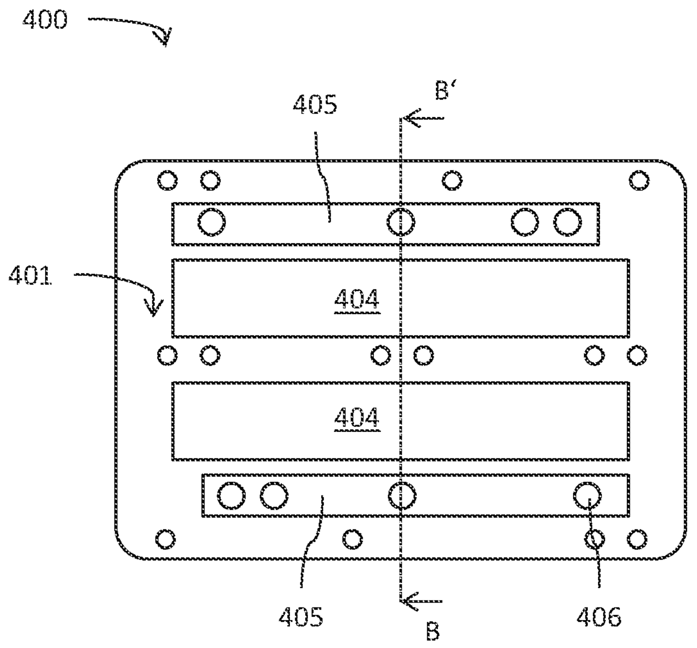
FIGS. 4A and 4B show a plan view (FIG. 4A) and a sectional view (FIG. 4B) of a heatsink configured to be coupled to a semiconductor module.
Figure 4B:
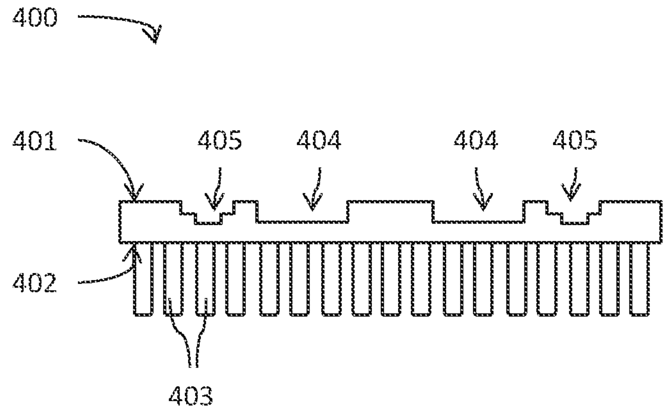

FIGS. 4A and 4B show a heatsink 400 configured to be coupled to the semiconductor module 100. FIG. 4A shows a plan view of the heatsink 400 and FIG. 4B shows a sectional view along the line B-B'.

The heatsink 400 comprises a first side 401 and an opposite second side 402, wherein the first side 401 is configured to face the semiconductor module 100. The second side 402 may comprise a plurality of cooling structures 403, e.g. cooling fins. According to an example, the heatsink 400 is configured to be coupled to a fluid channel such that the cooling structures 403 are in contact with a cooling fluid. According to another example, the heatsink 400 is configured to be in contact with air.

As shown in FIGS. 4A and 4B, the first side 401 of the heatsink may comprise one or more first trenches 404 and/or one or more second trenches 405. The one or more first trenches 404 may be configured to accept the semiconductor packages 120 and the one or more second trenches 405 may be configured to accept the one or more bus bars 130.

The first and second trenches 404, 405 may have any suitable depth, for example a depth of 1 mm or more, 2 mm or more, 3 mm or more, 5 mm or more, or 10 mm or more. The first trench(es) 404 may have the same or a different depth compared to the second trench(es) 405.

The one or more second trenches 405 may optionally comprise depressions 406 at the bottom of the trench(es) 405, wherein the depressions 406 are configured to accept the screws 131 (or rivets or pins).

A heatsink similar to the heatsink 400 may be joined to the semiconductor module 200. However, in this case no second trenches 405 are arranged laterally next to the first trenches 404. Instead, the heatsink might only comprise the first trenches 404. The first trenches 404 may however have a stepped cross section, wherein the first step is configured to accept the semiconductor packages 120 and the second step is configured to accept the bus bar 130.

Figure 5:
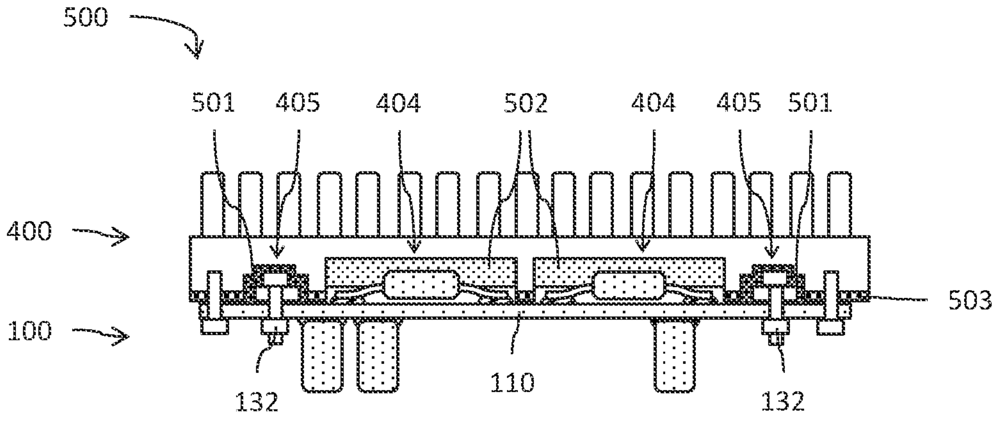
FIG. 5 shows a sectional view of a power electronic system comprising a semiconductor module and a heatsink joined to the semiconductor module.

FIG. 5 shows a sectional view of a power electronic system 500 comprising the semiconductor module 100 and the heatsink 400. A similar power electronic system may comprise the semiconductor module 200 and a corresponding heatsink.

According to an example, the power electronic system 500 comprises an adhesive material 501 joining the bus bar 130 to the heatsink 400. The adhesive material 501 furthermore electrically isolates the bus bar 130 from the heatsink 400. According to an example, the adhesive material 501 is arranged in the second trenches 405 but not in the first trenches 404. The adhesive material 501 may for example comprise or consist of epoxy. The adhesive material 501 may for example join the bus bar 130 to the heatsink 400 in such a way that if the nuts 132 are removed, the bus bar 130 will remain affixed to the heatsink 400.

According to an example, the power electronic system 500 comprises a coupling material 502 thermally coupling the semiconductor packages 120 to the heatsink 400. The coupling material 502 may be a dielectric material. The coupling material 502 may for example be a thermal interface material (TIM). The coupling material 502 might for example be arranged in the first trenches 404 but not in the second trenches 405. The adhesive material 501 and the coupling material 502 may be different materials or the same materials. According to an example, the coupling material 502 is no dedicated adhesive material. According to an example, a further dielectric material 503 may be arranged between the PCB 110 and the heatsink 400. The further dielectric material 503 may for example be arranged on surfaces outside the first and/or second trenches 404, 405. The further dielectric material 503 may be the same material or a different material as the coupling material 502. According to an example, screws 131 may be used to mechanically couple the PCB 110 to the heatsink 400.

In the example of the power electronic system 500 shown in FIG. 5, a heatsink 400 is only arranged over one side (the first side 111) of the PCB 110. However, it is also possible that a second heatsink is arranged over the opposite side (second side 112) of the PCB 110. In other words, the power electronic system 500 may be configured for double sided cooling (DSC). In this case, power semiconductor packages 120 may for example be arranged over both sides 111, 112 of the PCB.

Figure 6:
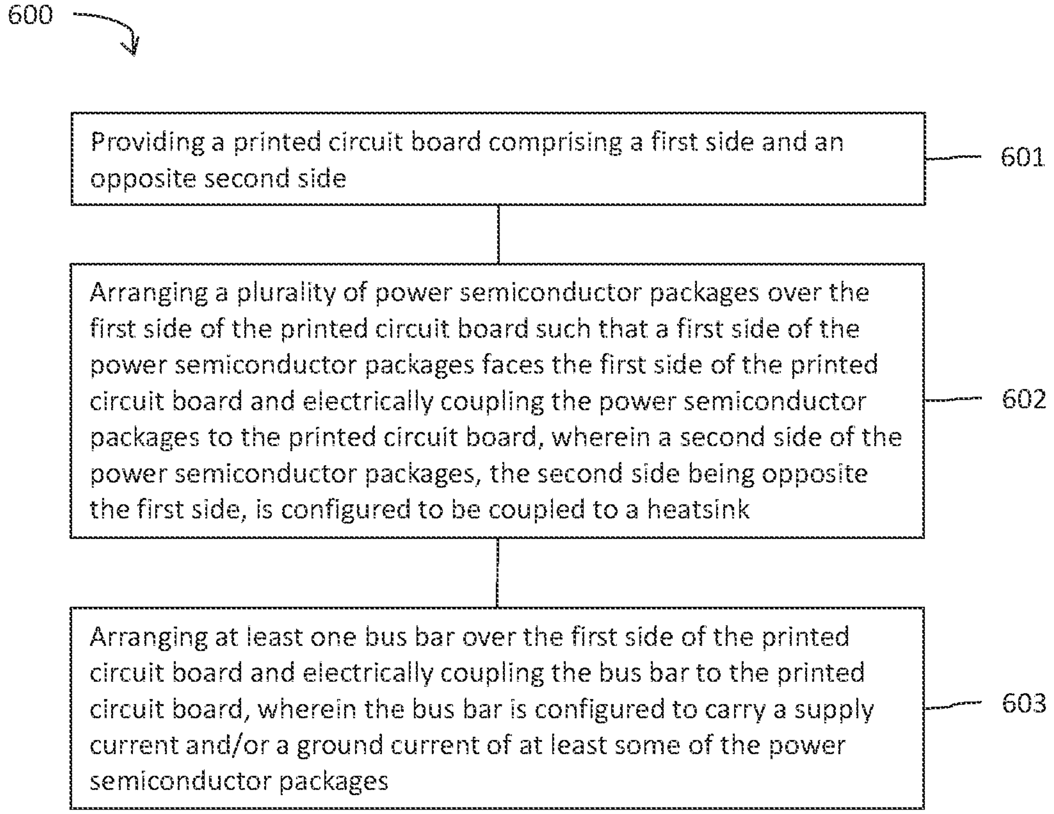
FIG. 6 is a flow chart of an exemplary method for fabricating a semiconductor module.

FIG. 6 is a flow chart of a method 600 for fabricating a semiconductor module. The method 600 may for example be used to fabricate the semiconductor modules 100 and 200.

The method 600 comprises at 601 a process of providing a printed circuit board comprising a first side and an opposite second side, at 602 a process of arranging a plurality of power semiconductor packages over the first side of the printed circuit board such that a first side of the power semiconductor packages faces the first side of the printed circuit board and electrically coupling the power semiconductor packages to the printed circuit board, wherein a second side of the power semiconductor packages, the second side being opposite the first side, is configured to be coupled to a heatsink, and at 603 a process of arranging at least one bus bar over the first side of the printed circuit board and electrically coupling the bus bar to the printed circuit board, wherein the bus bar is configured to carry a supply current and/or a ground current of at least some of the power semiconductor packages.

According to an example of the method 600, the bus bar is at least partially covered with an isolating layer configured to electrically isolate the bus ear from the heatsink.

Figure 7:
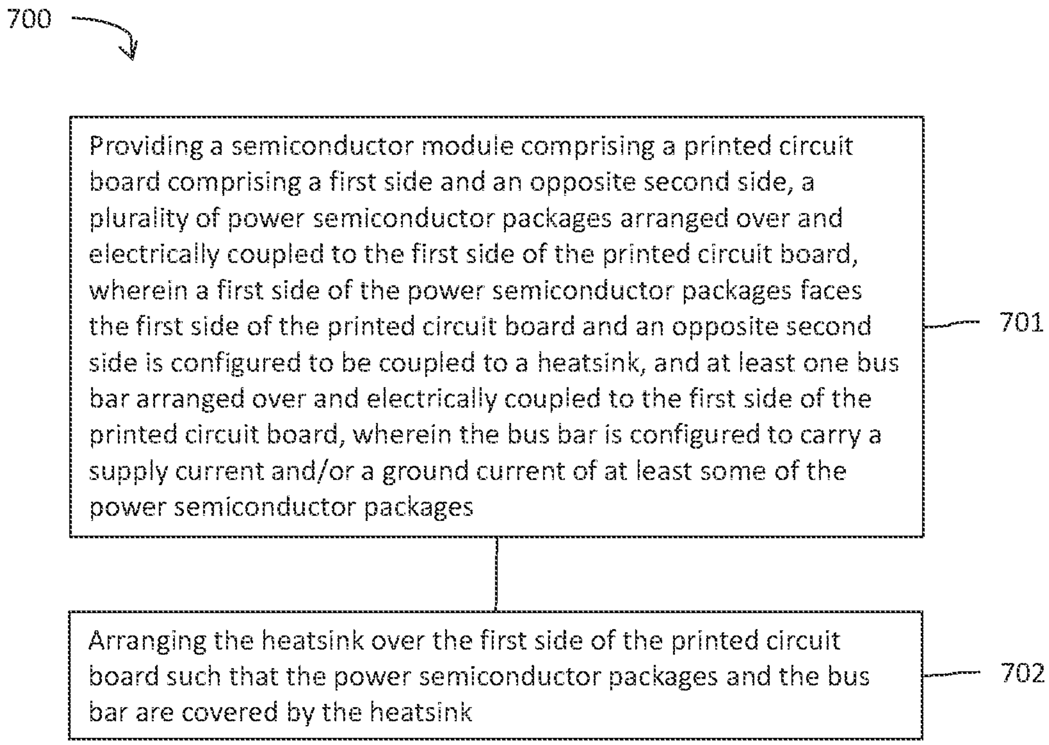
FIG. 7 is a flow chart of an exemplary method for fabricating a power electronic system.

FIG. 7 is a flow chart of a method 700 for fabricating a power electronic system. The method 700 may for example be used to fabricate the power electronic system 500.

The method 700 comprises at 701 a process of providing a semiconductor module comprising a printed circuit board comprising a first side and an opposite second side, a plurality of power semiconductor packages arranged over and electrically coupled to the first side of the printed circuit board, wherein a first side of the power semiconductor packages faces the first side of the printed circuit board and an opposite second side is configured to be coupled to a heatsink, and at least one bus bar arranged over and electrically coupled to the first side of the printed circuit board, wherein the bus bar is configured to carry a supply current and/or a ground current of at least some of the power semiconductor packages; and at 702 a process of arranging the heatsink over the first side of the printed circuit board such that the power semiconductor packages and the bus bar are covered by the heatsink.

In the following, the semiconductor module, the power electronic system and the methods for fabricating a semiconductor module or a power electronic system are further explained using specific examples.

Example 1 is a semiconductor module, comprising: a printed circuit board comprising a first side and an opposite second side, a plurality of power semiconductor packages arranged over and electrically coupled to the first side of the printed circuit board, wherein a first side of the power semiconductor packages faces the first side of the printed circuit board and an opposite second side is configured to be coupled to a heatsink, and at least one bus bar arranged over and electrically coupled to the first side of the printed circuit board, wherein the bus bar is configured to carry a supply current and/or a ground current of at least some of the power semiconductor packages.

Example 2 is the semiconductor module of example 1, wherein the bus bar is arranged laterally next to the power semiconductor packages.

Example 3 is the semiconductor module of example 1, wherein the bus bar is arranged over and electrically coupled to the second side of at least some of the power semiconductor packages.

Example 4 is the semiconductor module of one of the preceding examples, further comprising: pins and/or screws electrically coupling the bus bar to vias of the printed circuit board.

Example 5 is the semiconductor module of one of the preceding examples, wherein a primary path for dissipating heat away, from the power semiconductor packages is arranged at the second side of the power semiconductor packages.

Example 6 is the semiconductor module of one of the preceding examples, wherein the printed circuit board is free of an internal bus bar.

Example 7 is the semiconductor module of one of the preceding examples, wherein the bus bar is configured to be detachable from the printed circuit board.

Example 8 is the semiconductor module of one of the preceding examples, further comprising: spacers arranged be the printed circuit board and the bus bar.

Example 9 is the semiconductor module of one of the preceding examples, further comprising: an isolating layer at least partially covering the bus bar.

Example 10 is a power electronic system, comprising: the semiconductor module of one of examples 1 to 9, and a heatsink arranged over the first side of the printed circuit board such that the power semiconductor packages and the bus bar are covered by the heatsink, wherein the bus bar is thermally coupled to the heatsink.

Example 11 is the power electronic system of example further comprising: an adhesive material joining the bus bar to the heatsink, wherein the adhesive material electrically isolates the bus bar from the heatsink.

Example 12 is the power electronic system of example or 11, wherein the power semiconductor packages and the bus bar are arranged within one or more trenches in the heatsink.

Example 13 is a method for fabricating a semiconductor module, the method comprising: providing a printed circuit board comprising a first side and an opposite second side, arranging a plurality of power semiconductor packages over the first side of the printed circuit board such that a first side of the power semiconductor packages faces the first side of the printed circuit board and electrically coupling the power semiconductor packages to the printed circuit board, wherein a second side of the power semiconductor packages, the second side being opposite the first side, is configured to be coupled to a heatsink, and arranging at least one bus bar over the first side of the printed circuit board and electrically coupling the bus bar to the printed circuit board, wherein the bus bar is configured to carry a supply current and/or a ground current of at least some of the power semiconductor packages.

Example 14 is the method of example 13, wherein electrically coupling the bus bar to the printed circuit board comprises using pins and/or screws to electrically couple the bus bar to vies of the printed circuit board.

Example 15 is the method of example 13 or 14, further comprising: at least partially covering the bus bar with an isolating layer.

Example 16 is a method for fabricating a power electronic system, the method comprising: providing the semiconductor module of one of examples 1 to 9, and arranging a heats ink over the first side of the printed circuit board such that the power semiconductor packages and the bus bar are covered by the heatsink.

Example 17 is the method of example 16, further comprising: joining the bus bar to the heatsink with an adhesive material such that the adhesive material electrically isolates the bus bar from the heatsink.

Example 18 is the method of example 16 or 17, wherein the power semiconductor packages and the bus bar are arranged within one or more trenches in the heat sink.

Example 19 is an apparatus comprising means for performing the method according to anyone of examples 13 to 18.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor module, comprising:

a printed circuit board comprising a first side and an opposite second side;

a plurality of power semiconductor packages arranged over and electrically coupled to the first side of the printed circuit board, wherein a first side of the power semiconductor packages faces the first side of the printed circuit board and an opposite second side of the power semiconductor packages is configured to be coupled to a heatsink; and at least one bus bar arranged over and electrically coupled to the first side of the printed circuit board, wherein the bus bar is configured to carry a supply current and/or a ground current of at least some of the power semiconductor packages, wherein each of the power semiconductor packages comprises at least one power semiconductor die arranged on a die carrier, an encapsulation encapsulating the power semiconductor die, and external contacts exposed from the encapsulation and electrically coupled to the first side of the printed circuit board, wherein the bus bar is physically separate from each of the power semiconductor packages.

2. The semiconductor module of claim 1, wherein the bus bar is arranged laterally next to the power semiconductor packages.

3. The semiconductor module of claim 1, wherein the bus bar is arranged over and electrically coupled to the second side of at least some of the power semiconductor packages.

4. The semiconductor module of claim 1, further comprising:

a plurality of pins and/or screws electrically coupling the bus bar to vias of the printed circuit board.

5. The semiconductor module of claim 1, wherein a primary path for dissipating heat away from the power semiconductor packages is arranged at the second side of the power semiconductor packages.

6. The semiconductor module of claim 1, wherein the printed circuit board is free of an internal bus bar.

7. The semiconductor module of claim 1, wherein the bus bar is configured to be detachable from the printed circuit board.

8. The semiconductor module of claim 1, further comprising:

a plurality of spacers arranged between the printed circuit board and the bus bar.

9. The semiconductor module of claim 1, further comprising:

an isolating layer at least partially covering the bus bar.

10. A power electronic system, comprising:

the semiconductor module of claim 1; and a heatsink arranged over the first side of the printed circuit board such that the power semiconductor packages and the bus bar are covered by the heatsink, wherein the bus bar is thermally coupled to the heatsink.

11. The power electronic system of claim 10, further comprising:

an adhesive material joining the bus bar to the heatsink, wherein the adhesive material electrically isolates the bus bar from the heatsink.

12. The power electronic system of claim 10, wherein the power semiconductor packages and the bus bar are arranged within one or more trenches in the heatsink.

13. A method for fabricating a semiconductor module, the method comprising:

providing a printed circuit board comprising a first side and an opposite second side;

arranging a plurality of power semiconductor packages over the first side of the printed circuit board such that a first side of the power semiconductor packages faces the first side of the printed circuit board and electrically couples the power semiconductor packages to the printed circuit board, wherein a second side of the power semiconductor packages opposite the first side of the power semiconductor packages is configured to be coupled to a heatsink, wherein each of the power semiconductor packages comprises at least one power semiconductor die arranged on a die carrier, an encapsulation encapsulating the power semiconductor die, and external contacts exposed from the encapsulation and electrically coupled to the first side of the printed circuit board; and arranging at least one bus bar over the first side of the printed circuit board and electrically coupling the bus bar to the printed circuit board, wherein the bus bar is physically separate from each of the power semiconductor packages and configured to carry a supply current and/or a ground current of at least some of the power semiconductor packages.

14. The method of claim 13, wherein electrically coupling the bus bar to the printed circuit board comprises using a plurality of pins and/or screws to electrically couple the bus bar to vias of the printed circuit board.

15. The method of claim 13, further comprising:

at least partially covering the bus bar with an isolating layer.

16. A method for fabricating a power electronic system, the method comprising:

providing a semiconductor module, the semiconductor module comprising: a printed circuit board comprising a first side and an opposite second side; a plurality of power semiconductor packages arranged over and electrically coupled to the first side of the printed circuit board, wherein a first side of the power semiconductor packages faces the first side of the printed circuit board and an opposite second side of the power semiconductor packages is configured to be coupled to a heatsink, wherein each of the power semiconductor packages comprises at least one power semiconductor die arranged on a die carrier, an encapsulation encapsulating the power semiconductor die, and external contacts exposed from the encapsulation and electrically coupled to the first side of the printed circuit board; and at least one bus bar arranged over and electrically coupled to the first side of the printed circuit board, wherein the bus bar is physically separate from each of the power semiconductor packages and configured to carry a supply current and/or a ground current of at least some of the power semiconductor packages; and arranging a heatsink over the first side of the printed circuit board such that the power semiconductor packages and the bus bar are covered by the heatsink.

17. The method of claim 16, further comprising:

joining the bus bar to the heatsink with an adhesive material such that the adhesive material electrically isolates the bus bar from the heatsink.

18. The method of claim 16, wherein the power semiconductor packages and the bus bar are arranged within one or more trenches in the heatsink.

* * * * *